United States Patent
Chen et al.

(10) Patent No.: US 6,420,226 B1
(45) Date of Patent: Jul. 16, 2002

(54) METHOD OF DEFINING A BURIED STACK CAPACITOR STRUCTURE FOR A ONE TRANSISTOR RAM CELL

(75) Inventors: Wen-Cheng Chen, Hsinchu; Kuo-Ching Huang, Kaohsiung; Chen-Jong Wang; Wen-Chuan Chiang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/020,753

(22) Filed: Dec. 12, 2001

(51) Int. Cl.[7] .......................................... H01L 21/8244
(52) U.S. Cl. ................... 438/238; 438/385; 438/381; 438/382; 438/383; 438/384
(58) Field of Search ........................ 438/238, 381–385

(56) References Cited

U.S. PATENT DOCUMENTS

| | | | |
|---|---|---|---|
| 5,468,979 A | 11/1995 | Tani et al. | 257/304 |
| 5,805,494 A | 9/1998 | El-Kareh et al. | 365/149 |
| 5,972,759 A * | 10/1999 | Liaw | 438/238 |
| 6,013,547 A * | 1/2000 | Liaw | 438/238 |
| 6,080,638 A | 6/2000 | Lin et al. | 438/425 |
| 6,130,470 A * | 10/2000 | Selcuk | 257/532 |
| 6,150,686 A | 11/2000 | Sugiura et al. | 257/301 |
| 6,174,764 B1 * | 1/2001 | Manning | 438/238 |
| 6,340,623 B1 * | 1/2002 | Park | 257/263 |

\* cited by examiner

Primary Examiner—John F. Niebling
Assistant Examiner—Jennifer M. Kennedy
(74) Attorney, Agent, or Firm—George O. Saile; Stephen B. Ackerman

(57) ABSTRACT

A process for fabricating a buried stack capacitor structure, to be used in a one transistor, RAM cell, has been developed. The process features formation of a self-aligned, ring shaped storage node opening, formed in a top portion of an silicon oxide filled, shallow trench shape, via a selective dry etch procedure. The selective dry etch procedure in combination with subsequent selective wet etch procedures, create bare portions of semiconductor substrate at the junction of the ring shaped storage node opening and the adjacent top surface of semiconductor, allowing a heavily doped region to be created in this region. The presence of the heavily doped region reduces the node to substrate resistance encountered when a storage node structure is formed in the ring shaped storage node structure, as well as on the overlying the heavily doped region.

27 Claims, 7 Drawing Sheets

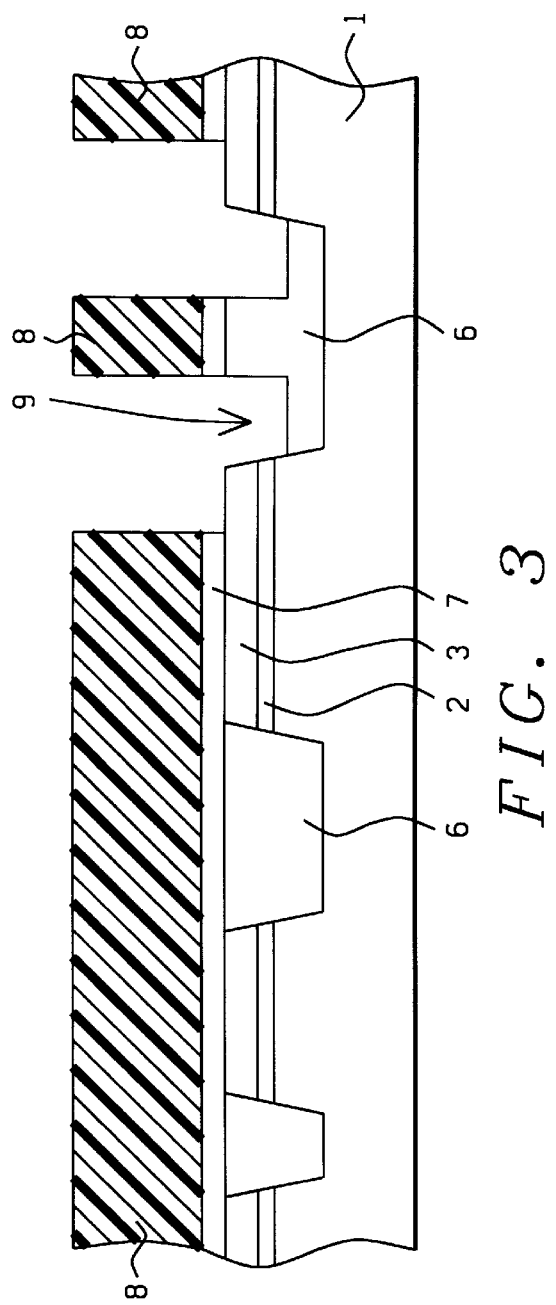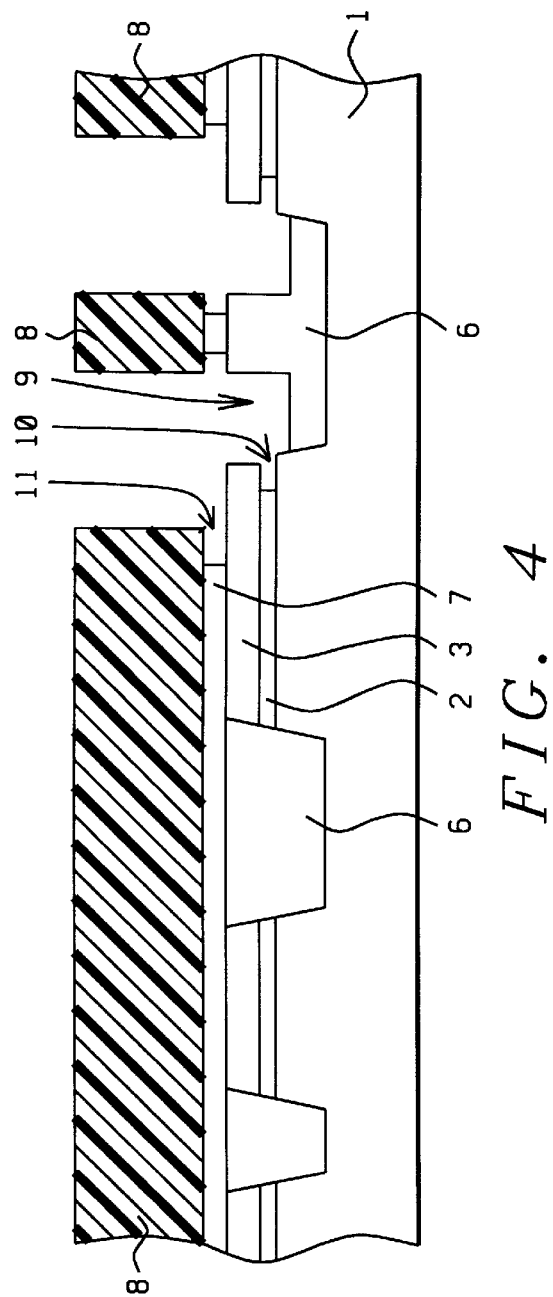

METHOD OF DEFINING A BURIED STACK CAPACITOR STRUCTURE FOR A ONE TRANSISTOR RAM CELL

BACKGROUND OF THE INVENTION (1) Field of the Invention

The present invention relates to methods used to fabricate semiconductor devices, and more specifically to a method used to form a buried stack capacitor structure for a one transistor, random access memory (1T RAM), cell.

(2) Description of Prior Art

SRAM cells have in the past been fabricated using six transistors, usually comprised of four N channel, metal oxide semiconductor field effect transistor (MOSFET), devices, and of two P channel MOSFET devices. However to reduce processing costs the semiconductor industry has been attempting to fabricate smaller chips, with the smaller semiconductor chips still however offering device densities equal to, or greater than counterpart larger semiconductor chips. The attainment of a larger number of smaller semiconductor chips on a specific size starting substrate allow the processing cost of a specific chip to be reduced. However the use of smaller chips for SRAM technology create problems when attempting to place six transistors on the smaller semiconductor chip Therefore SRAM designs have focused on one transistor, 1T SRAM cells, comprised with a single metal oxide semiconductor field effect transistor (MOSFET) device, and a capacitor structure. This configuration, featuring a single transistor and a single capacitor structure, provides the same function as the six transistor design, however requiring less space and thus fulfilling the objective of constructing smaller semiconductor chips.

This invention will describe a novel process sequence in which a 1T RAM cell is fabricated using a buried stacked capacitor structure. A buried stacked capacitor structure requires less space than counterpart trench type, or stacked type capacitor structures. In addition the buried stack capacitor structure featured in this invention includes novel process features such as definition of a ring shaped storage node opening via a self-aligned etching procedure, as well as featuring the use of a combination of isotropic wet etch procedures, allowing a highly doped, implanted region to be formed at the interface of the storage node structure and semiconductor substrate, thus reducing the series resistance between these elements Prior art such as Selcuk, in U.S. Pat. No. 6,130,470, describe a process for forming buried sidewall capacitors between storage nodes, for a SRAM cell, however that prior art does not describe the novel process features highlighted in this present invention directed at fabrication of a buried stack capacitor structure as an component of a 1T RAM cell.

SUMMARY OF THE INVENTION

It is an object of this invention to fabricate a one transistor, static random access memory (1T RAM), cell, featuring a single MOSFET device and a buried stacked capacitor structure.

It is another object of this invention to define a self-aligned opening for the storage node structure of the buried stacked capacitor structure as part of the shallow trench isolation (STI) fabrication process, via a self-align etching procedure.

It is still another object of this invention to use isotropic etch procedures to laterally etch insulator layers, exposing regions of a semiconductor substrate and allowing a heavily doped region to be formed in these exposed regions, which when overlaid with a subsequent storage node structure, result in reduced node to substrate series resistance.

In accordance with the present invention a method of fabricating a buried stack capacitor structure for a 1T RAM cell is described. After formation of a silicon oxide filled, STI region in a composite insulator layer comprised of a silicon nitride layer and an underlying pad silicon oxide layer, and in a top portion of a semiconductor substrate, a silicon oxide cap layer is deposited. Photolithographic, (featuring a photoresist shape with an opening larger in diameter than the diameter of the STI region), and selective dry etching procedures, are used for self-aligned removal of a top portion of the silicon oxide in the STI region, with the selective dry etch procedure terminating at the appearance of the silicon nitride layer located overlying the top surface of the semiconductor substrate, adjacent to the perimeter of the STI region. In addition part of the photoresist shape is also used to protect a center portion of the STI region from the dry etch procedure, resulting in an STI shape comprised of an unetched, thick region of silicon oxide located in the center of the STI region, surrounded by the thinner, partially etched, silicon oxide. Lateral, isotropic etching of the cap, and pad silicon oxide layer exposing a portion of silicon nitride, followed by removal of the exposed silicon nitride portion, exposes a region of the semiconductor substrate adjacent to the edge of the STI region- A heavily doped region is then formed in exposed regions, such as the exposed region of semiconductor substrate located adjacent to the edge of the ST region, as well as in the sides of the same semiconductor substrate, exposed in the thinned STI region. Deposition of a polysilicon layer, followed by a chemical mechanical polishing (CXP) procedure, results in a storage node structure comprised with horizontal features located on the bottom surfaces of the partially etched STI region, as well as on the top surface of the heavily doped region in semiconductor substrate, and comprised of attaching vertical features located on the heavily doped sides of the semiconductor substrate, exposed in the partially etched STI region. Subsequent processing features formation of a capacitor dielectric layer on the polysilicon storage node structure, followed by formation of a capacitor top plate structure, resulting in a ring shaped, buried stacked capacitor structure for a 1T RAM cell, in which the substrate to node series resistance is minimized via use of the heavily doped region formed in a region encompassing the interface of the semiconductor substrate and the side of the partially etched STI region.

BRIEF DESCRIPTION OF THE DRAWINGS

The object and other advantages of this invention are best described in the preferred embodiment with reference to the attached drawings that include:

FIGS. 1–14, which schematically, in cross-sectional style, describe key processing stages used to fabricate a buried stacked capacitor structure for a 1T RAM cell.

DESCRIPTION OF THE PREFERRED EMBODIMENTS

Figure 1:
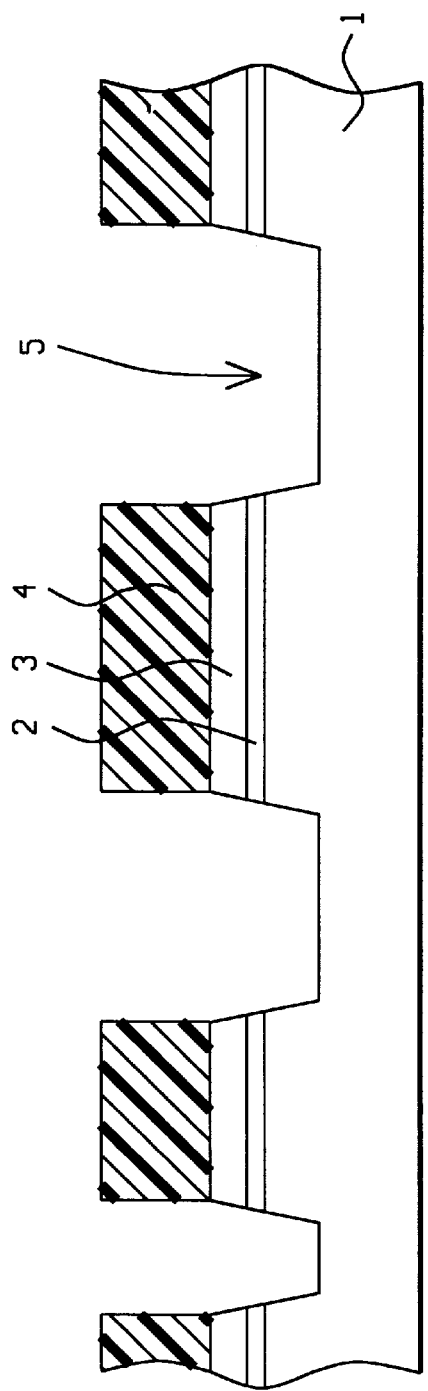

The method of fabricating a buried stacked capacitor structure, to be incorporated into a one transistor, RAM cell, will now be described in detail. Semiconductor substrate 1, comprised of P type, single crystalline, featuring a <100> crystallographic orientation, is used and schematically shown in FIG. 1. Silicon dioxide layer 2, used as a pad oxide layer, is thermally grown on the surface of semiconductor substrate 1, at thickness between about 50 to 300 Angstroms, followed by deposition of silicon nitride layer 3, via low pressure chemical vapor deposition (LPCVD), or plasma enhanced chemical vapor deposition (PECVD), procedures, at a thickness between about 1000 to 2000 Angstroms. Photoresist shape 4, is next used as a mask to allow a reactive ion etching procedure, using $CF_4$ as an etchant for silicon nitride and silicon oxide, and using $Cl_2$ or $SF_6$ as an etchant for silicon, to define shallow trench openings 5. Shallow trench openings 5, are defined to a depth between about 2000 to 5000 Angstroms, in semiconductor substrate 1. The result of these procedures is schematically shown in FIG. 1.

Figure 2:
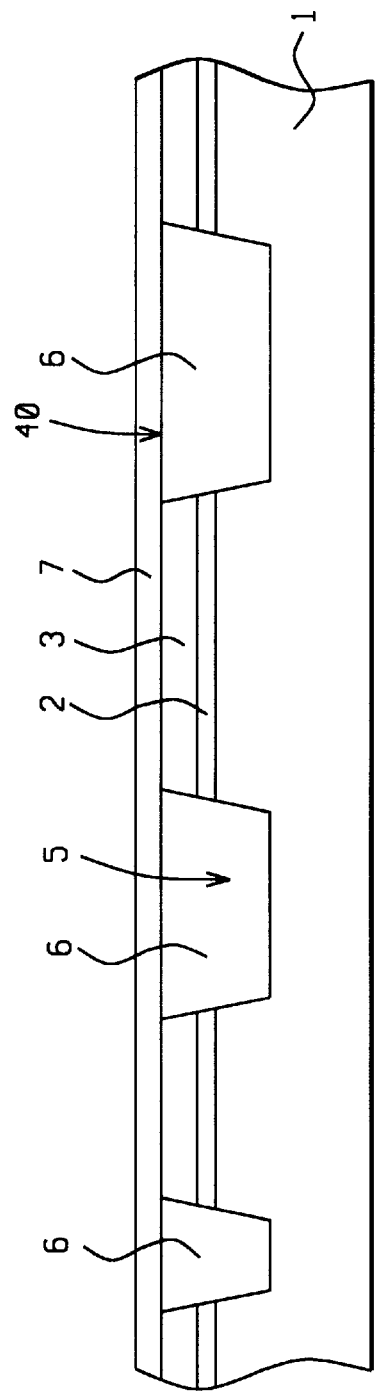

After removal of photoresist shape 4, via plasma oxygen ashing procedures, silicon oxide layer 6, is deposited via LPCVD or PECVD procedures, to a thickness between about 4000 to 9000 Angstroms, completely filling shallow trench shapes 5. Silicon oxide layer 6, is obtained using tetraethylorthosilicate (TEOS), as a source. A chemical mechanical polishing (CMP), procedure is next employed to remove portions of silicon oxide layer 6, from the top surface of silicon nitride layer 3, resulting in the insulator filled, shallow trench isolation (STI), shapes 40, schematically shown in FIG. 2. If desired unwanted portions of silicon oxide layer 6, can be selectively removed from the top surface of silicon nitride layer 3, via a selective RIE procedure using $CHF_3$ as an etchant for silicon oxide. After formation of STI regions 40, silicon oxide layer 7, to be used as a cap oxide layer, is deposited via LPCVD or PECVD procedures, at a thickness between about 100 to 1000 Angstroms.

A critical photolithographic and dry etching procedure, defining ring shaped storage node opening 9, to be used to accommodate a storage node component of the buried stacked capacitor structure, is next addressed. Photoresist shape 8, is used as a mask to allow an anisotropic RIE procedure to selectively remove portions of exposed silicon oxide regions, resulting in opening 9, with the thickness of silicon oxide now remaining at the bottom of opening 9, between about 1000 to 3000 Angstroms The selective RIE procedure is performed using $CHF_3$ as an etchant for silicon oxide, featuring an etch rate ratio of silicon oxide to silicon nitride between about 3 to 10, to 1. The desirable etch rate selectivity allows the opening, or the exposed area in photoresist shape 8, to be designed larger than the diameter of STI region 40, resulting in self-alignment of opening 9, allowing unprotected silicon oxide portions of STI region to be removed, while regions of silicon nitride layer 3, now exposed after RIE removal of exposed regions of cap silicon oxide layer 7, remain unetched. Opening 9, in STI region 40, to be subsequently used to accommodate the storage node component of the buried stacked capacitor structure, is also comprised with an unetched portion of silicon oxide layer 6, located in the center of opening 9. This portion of silicon oxide layer 6, protected by a portion of photoresist shape 8, during the definition of opening 9, will provide a shape, comprised with vertical features, that will allow increased storage node surface area to be realized. The result of this definition procedure is schematically shown in FIG. 3.

Figure 5:
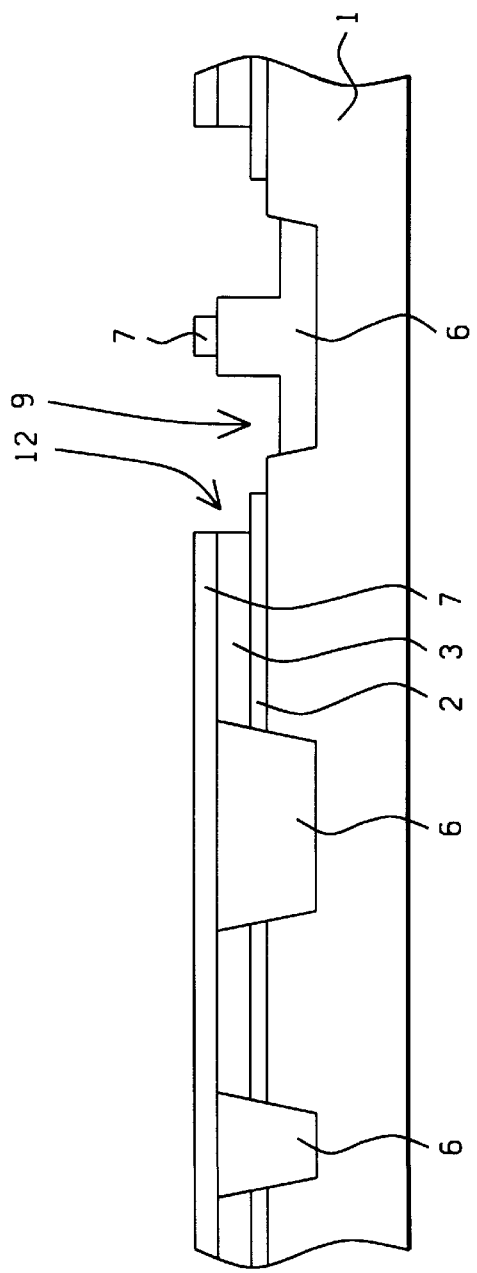
Figure 6:
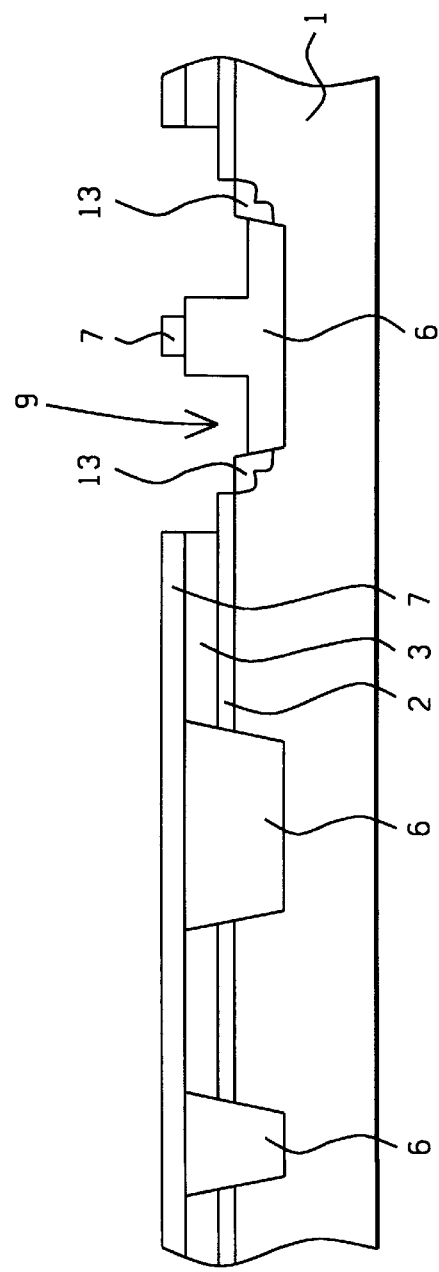

Prior to removal of photoresist shape 8X a pull back procedure applied to cap silicon oxide layer 7, and to pad silicon dioxide layer 2, is performed. The lateral etching of these layers is accomplished via use of a buffered hydrofluoric (B,) or a dilute hydrofluoric (DHEF), solution, resulting in lateral undercut 11, in cap silicon oxide layer 7, and lateral undercut 10, in pad silicon oxide layer 2. This is schematically shown in FIG. 4. After removal of photoresist shape 8, via plasma oxygen ashing procedures, portions of silicon nitride layer 3, now exposed after the lateral etching of the oxide layers, is selectively removed or pulled back, via use of a hot phosphoric acid solution. This is schematically shown in FIG. 5. Pull back or laterally etched region 12, of silicon nitride layer 3, allows implantation of P type, or N type ions, to be performed in exposed regions of semiconductor substrate 1, regions such as the bare semiconductor sides in opening 9, in which silicon oxide layer 6, had been removed, as well as top semiconductor surfaces, exposed by pull back of the silicon nitride layer. If a P channel MOSFET device is to be used as the transistor in the 1T RAM, heavily doped region 13, will be a heavily doped P type region, obtained via implantation of boron or $BF_2$ ions at an energy between about 3 to 10 Kev, at a dose between about 1E14 to 1E16 atoms/cm$^2$. However if the 1T RAM cell is to be comprised with a N channel MOSFET device, heavily doped region 13, will be achieved via implantation of arsenic or phosphorous ions, at an energy between about 10 to 50 KeV, and at a dose between about 1E14 to 1E16 atoms/cm$^2$. The result of formation of heavily doped region 13, made possible by lateral pull back of silicon nitride and silicon oxide layers, is schematically shown in FIG. 6.

Figure 7:
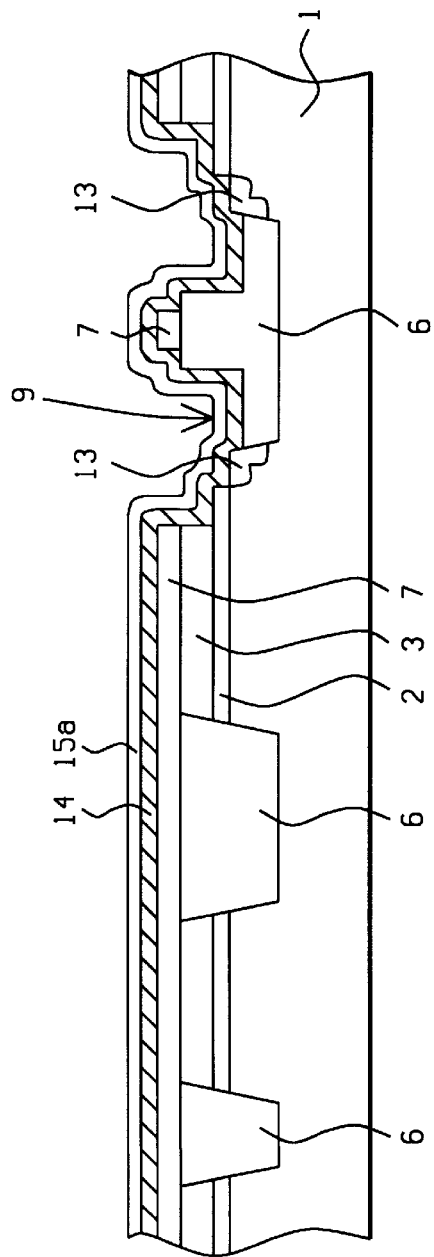

Intrinsic polysilicon layer 14, is next deposited via LPCVD procedures to a thickness between about 100 to 500 Angstroms, contouring all surfaces of opening 9, followed by an implantation procedure, performed using boron or $BF_2$ ions at an energy between about 3 to 10 KeV, at a dose between about 1E14 to 1E16 atoms/cm$^2$, converting intrinsic polysilicon layer 14, to a P+ polysilicon layer. Composite insulator 15a, comprised of an underlying silicon nitride layer at a thickness between about 40 to 60 Angstroms, and an overlying silicon oxide layer at a thickness between about 250 to 350 Angstroms, is next deposited on polysilicon layer 14. The result of these depositions is schematically shown in FIG. 7.

Figure 8:
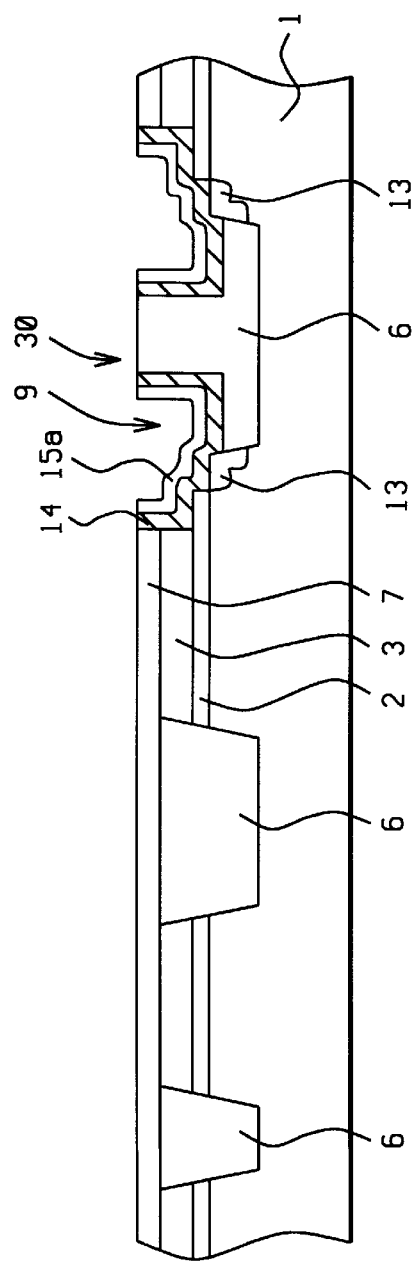

A CMP procedure is now employed planarizing and removing top portions of composite insulator layer 15a, polysilicon layer 14, and cap oxide layer 7, from the top surface of thicker, LPCVD or PECVD silicon nitride layer 3, with the CMP procedure terminating at the appearance of silicon nitride layer 3, resulting in ring shaped, storage node structure 30, located in opening 9. The thin silicon nitride component of composite insulator layer 15a, offered no resistance to the CMP procedure, unlike the denser, and thicker silicon nitride layer 3, obtained via LPCVD or PECVD procedures, thus serving as a removal stop during the CMP procedure. Storage node structure 30, comprised of P+ polysilicon, and overlaid with composite insulator layer 15a, interfaces heavily doped P+ region 13, at the edges of opening 9, allowing the series resistance generated at the interface of the storage node structure and a P+ source/drain region of a subsequent PMOS transistor, to be minimized when compared to counterparts fabricated without formation of heavily doped region at this specific location. This is schematically shown in FIG. 8.

Figure 9:
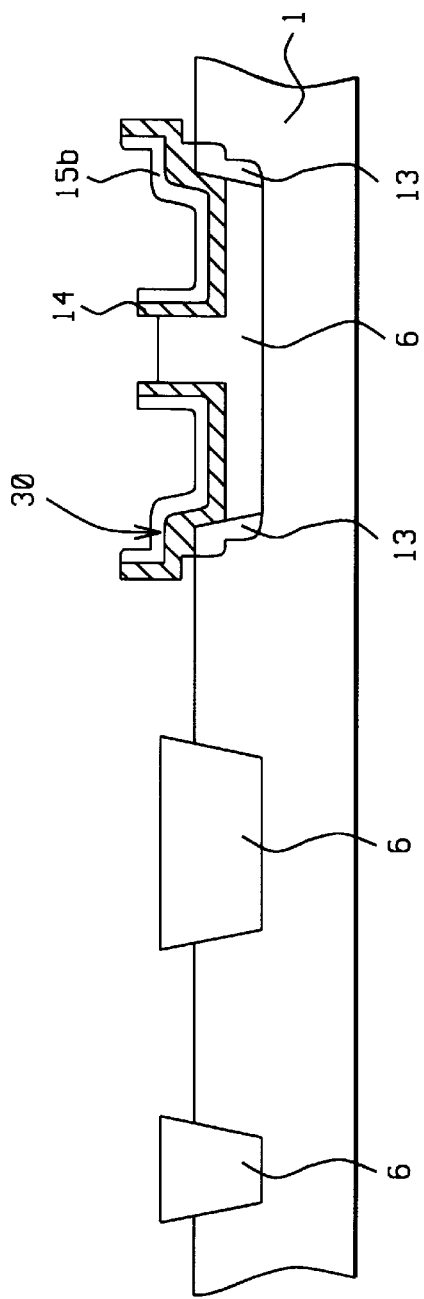

A hot phosphoric acid solution is next employed to selectively remove silicon nitride layer from the surface of pad silicon oxide layer 2. The silicon oxide component of composite insulator layer 15a, protects the silicon nitride component of composite insulator layer 15a, located on ring shaped, storage node structure 30, during the hot phosphoric acid procedure. This is followed by a DHF or BHF procedure, used to remove pad silicon dioxide layer 2, from the top surface of semiconductor substrate 1. This wet etch procedure also removes the silicon oxide component of composite insulator layer 15a, resulting in only insulator layer 15b, comprised only of the silicon nitride layer, overlying ring shaped, storage node structure 30. This is schematically illustrated in FIG. 9.

Figure 10:
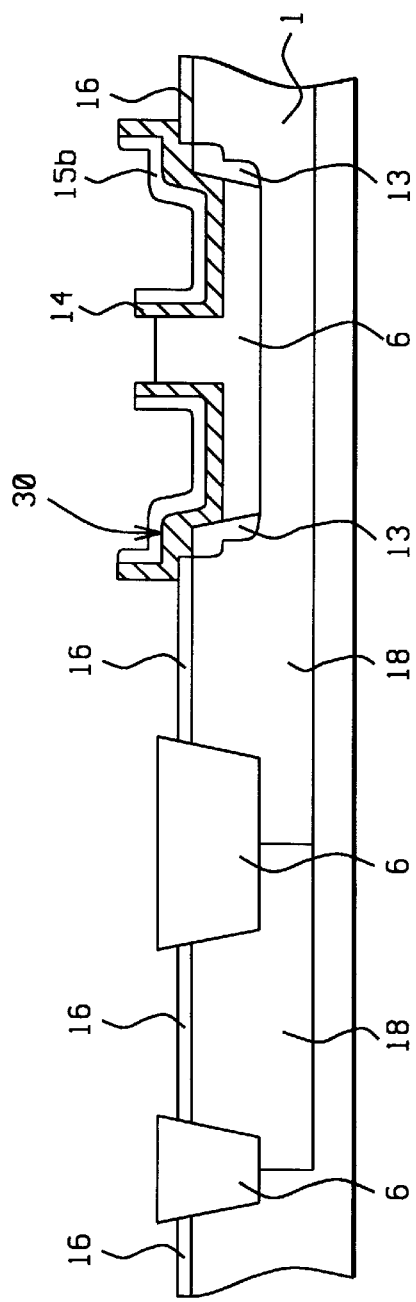
Figure 11:
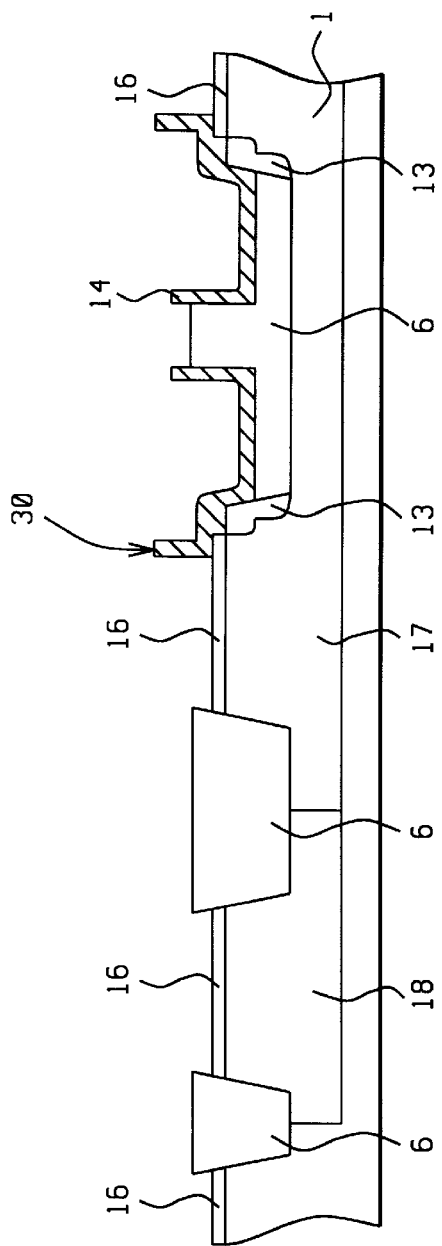

A thermal oxidation procedure is next employed to grow silicon dioxide layer 16, at a thickness between about 50 to 300 Angstroms, on exposed surfaces of semiconductor substrate 1. Silicon nitride component 15b, prevented oxidation of ring shaped, storage node structure 30. A photoresist shape, (not shown in the drawings), is next used as a block out mask to allow formation of N well region 17, to be accomplished in a first region of semiconductor substrate 1, to subsequently accommodate the P channel (PMOS), transistor of the 1T RAM cell. The implantation procedure is performed using arsenic or phosphorous ions, implanted at an energy between about 100 to 500 KeV, at a dose between about 1E12 to 5E13 atoms/cm$^2$. After removal of the photoresist mask used to form the N well region in a first region of semiconductor substrate 1, via plasma oxygen ashing, another photoresist shape is formed and used to protect the first region of semiconductor substrate 1, from a P type implantation procedure, used to form an P well region in a second region of semiconductor substrate 1 This implantation procedure is performed using boron ions implanted at an energy between about 100 to 500 KeV, at a dose between about 1E12 to 5E13 atoms/cm$^2$, resulting in the formation of P well region 18, in a second region of semiconductor substrate 1, to be used to accommodate N channel (NMOS) transistors used for logic circuits located adjacent to the 1T RAM cell. Removal of this photoresist block out shape is again accomplished via plasma oxygen ashing procedures. The result of these procedures are schematically described using FIG. 10. Selective removal of silicon nitride component 15b, from the top surface of storage node structure 30Q is now performed via use of a hot phosphoric acid solution. This is schematically shown in FIG. 11.

Figure 12:
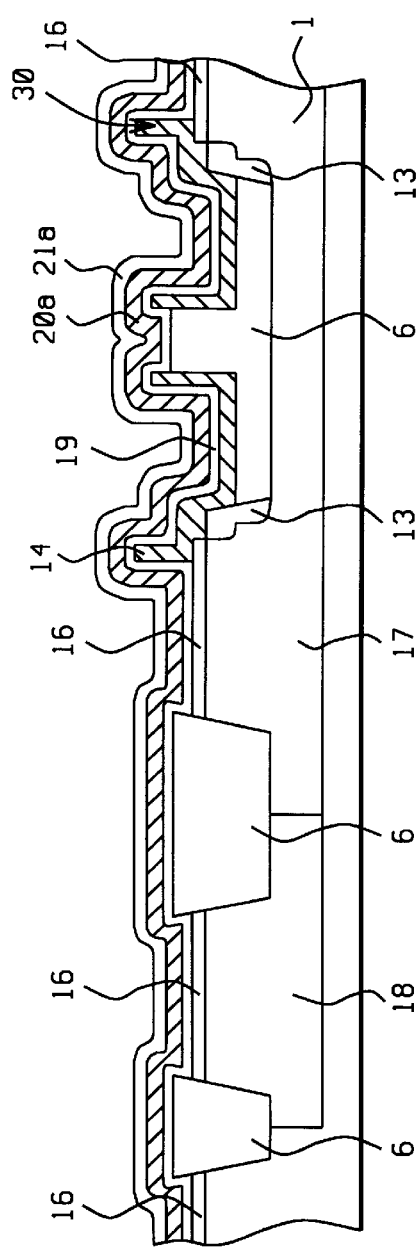
Figure 13:
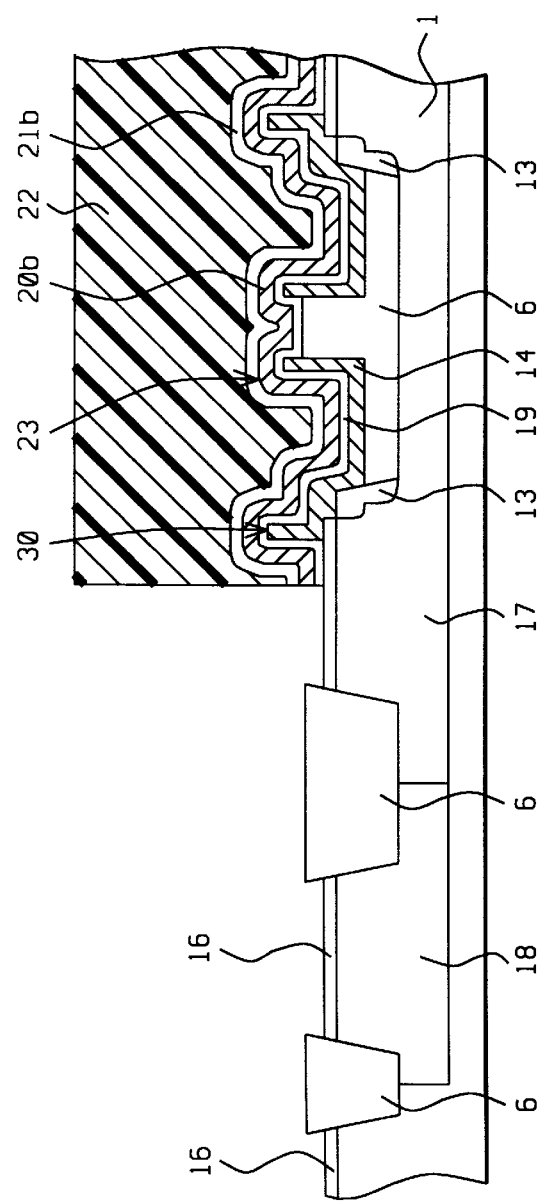
Figure 14:
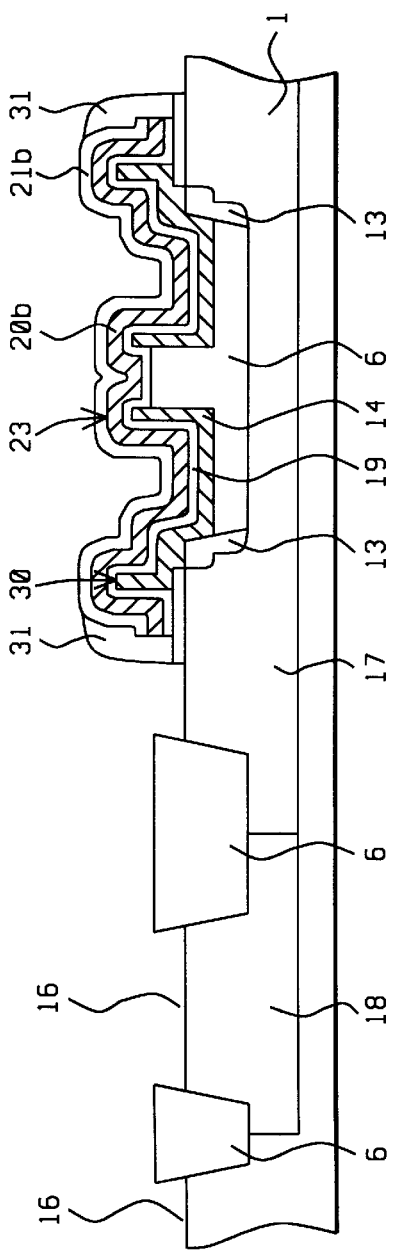

Capacitor dielectric layer 19; such as an oxidized silicon nitride (NO) layer, is next formed on the top surface of ring shaped, storage node structure 30, at a thickness between about 40 to 60 Angstroms. This is accomplished via deposition of a silicon nitride layer at a thickness between about 40 to 60 Angstroms, via LPCVD or PECVD procedures, followed by thermal oxidation of the entire silicon nitride layer. If desired capacitor dielectric layer can also be an oxidized silicon nitride layer on silicon oxide (ONO), or a deposited tantalum oxide layer. An intrinsic polysilicon layer is next deposited via LPCVD procedures at a thickness between about 200 to 800 Angstroms, followed by implantation of boron ions at an energy between about 3 to 10 KeV, and at a dose between about 1E14 to 1E16 atoms/cm$^2$, creating P+ polysilicon layer 20a. Insulator layer 21a, comprised of either silicon nitride or a silicon oxynitride-silicon oxide composite, is then formed on P+ polysilicon layer 20a, via LPCVD or PECVD procedures, at a thickness between about 100 to 500 Angstroms. This is schematically shown in FIG. 12. Photoresist shape 22, is then employed as an etch mask, allowing an anisotropic RIE procedure to define buried stack capacitor structure 23, shown schematically in FIG. 13. The anisotropic RIE procedure is performed using $Cl_2$ as an etchant for insulator layer 21a, P+ polysilicon layer 20a, and capacitor dielectric layer 19, with the selective, anisotropic RIE procedure terminating at the top surface of silicon dioxide layer 16. Buried stack capacitor structure 23, overlaid by insulator shape 21b, defined from insulator shape 21a, is comprised of upper plate structure 20b, defined from P+ polysilicon layer 20a, capacitor dielectric layer 19, and storage node structure 30, defined from P+ polysilicon layer 14. After definition of buried stack capacitor structure 23, photoresist shape 22, is removed via plasma oxygen ashing procedures.

Another silicon nitride layer is deposited at a thickness between about 150 to 250 Angstroms, followed by an anisotropic RIE procedure, using $Cl_2$ or $CF_4$, as an etchant for the silicon nitride layer, resulting in a silicon nitride spacer formed on the sides of buried stack capacitor structure 30. (The silicon nitride spacer is not shown in the drawings). Silicon dioxide layer 16, is next selectively removed from the surface of semiconductor substrate 1, via a DHF or BHF procedure, with LP silicon nitride spacers and insulator shape 21b, protecting buried capacitor structure 23. This is followed by deposition of a silicon oxide layer, at a thickness between about 900 to 1100 Angstroms, via PECVD procedures, using TEOS as a source, then subjected to an anisotropic RIE procedure, using $CHF_3$ as an etchant, creating composite insulator spacers 31, on the sides of buried stack capacitor structure 23. Composite insulator spacers 31, are comprised of overlying silicon oxide shapes, formed from the PETEOS silicon oxide layer, and comprised of underlying LP silicon nitride spacers.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a buried stack capacitor structure on a semiconductor substrate, comprising the steps of:

forming a composite insulator layer on said semiconductor substrate;

forming a shallow trench shape in said composite insulator layer and in a top portion of said semiconductor substrate;

filling said shallow trench shape with an insulator layer, resulting in a shallow trench isolation (STI) region;

performing a dry etch patterning procedure removing a top portion of said insulator layer from a peripheral area in said STI region exposing bare semiconductor sidewalls in a top portion of said STI region, while said insulator layer residing in center of said STI region remains unetched, resulting in a ring shaped storage node opening in said STI region comprised of unetched insulator layer in center of STI region, and a partially etched insulator layer residing at the periphery in said STI region;

laterally removing portions of said composite insulator layer located adjacent to said ring shaped storage node opening exposing a portion of said semiconductor substrate, and creating a bare semiconductor substrate region at a junction formed by the bare semiconductor sidewalls in a top portion of said STI region, and by the region of bare semiconductor substrate created after lateral removal of portions of said composite insulator layer;

forming heavily doped regions in said bare semiconductor substrate region;

forming a storage node structure in said ring shaped storage node opening, with first portions of said storage node structure horizontally overlying unetched bottom portions of said STI region as well as vertically overlying sides of said unetched portion of said STI region, and with second portions of said storage node structure vertically and horizontally overlying said heavily doped regions in said semiconductor substrate;

forming a capacitor dielectric layer on said storage node structure;

forming an upper plate structure resulting in said buried stacked capacitor structure comprised of said upper plate structure, said capacitor dielectric layer, and said storage node structure; and forming a composite insulator spacer on the sides of said buried stack capacitor structure.

2. The method of claim 1, wherein said composite insulator layer is comprised of an underlying silicon dioxide layer, obtained via thermal oxidation procedures at a thickness between about 50 to 300 Angstroms, and comprised of a silicon nitride layer, obtained via LPCVD or PECVD procedures at a thickness between about 1000 to 2000 Angstroms.

3. The method of claim 1, wherein said shallow trench shape is formed in said composite insulator layer, and in said semiconductor substrate to a depth between about 2000 to 5000 Angstroms, via a dry etching procedure using $CF_4$ as an etchant for silicon nitride and silicon oxide, and using $Cl_2$ or $SF_6$ as an etchant for silicon.

4. The method of claim 1, wherein said insulator layer used to fill said shallow trench shape is a silicon oxide layer, obtained via LPCVD or PECVD procedures at a thickness between about 4000 to 9000 Angstroms, using tetraethylorthosilicate (TEOS) as a source.

5. The method of claim 1, wherein said ring shaped storage node opening is formed in said STI region via a selective RIE procedure, using $CHF_3$ as an etchant for silicon oxide, with an etch rate ratio of silicon oxide to silicon nitride between about 3 to 10, to 1.

6. The method of claim 1, wherein the depth of, or the thickness of silicon oxide removed during formation of, said ring shaped storage node opening, is between about 1000 to 3000 Angstroms.

7. The method of claim 1, wherein laterally removed portions of said composite insulator layer are accomplished using a buffered, or dilute HF acid solution for capping and pad silicon oxide layers, while a hot phosphoric acid is used to laterally remove silicon nitride.

8. The method of claim 1, wherein said heavily doped regions are heavily doped P type regions, formed in said bare semiconductor substrate region via implantation of boron or $BF_2$ ions at a energy between about 3 to 10 KeV, and at a dose between about 1E14 to 1E16 atoms/$cm^2$.

9. The method of claim 1, wherein said storage node structure is a polysilicon storage node structure, formed from a polysilicon layer which in turn is obtained intrinsically via LPCVD procedures at a thickness between about 100 to 500 Angstroms, then doped via implantation of boron or $BF_2$ ions at an energy between about 3 to 10 KeV, at a dose between about 1E14 to 1E16 atoms/$cm^2$.

10. The method of claim 1, wherein said storage node structure is defined in said ring shaped storage node opening via a chemical mechanical polishing (CMP) procedure, removing regions of polysilicon top surfaces of regions not located in said ring shaped storage node opening.

11. The method of claim 1, wherein said capacitor dielectric layer is an oxidized silicon nitride (NO) layer, obtained at a thickness between about 40 to 60 Angstroms, via oxidation of a silicon nitride layer which in turn is obtained via LPCVD or PECVD procedures to a thickness between about 40 to 60 Angstroms.

12. The method of claim 1, wherein said upper plate structure is a polysilicon upper plate structure, formed from a polysilicon layer which in turn is obtained intrinsically via LPCVD procedures at a thickness between about 200 to 800 Angstroms, then doped via implantation of boron or $BF_2$ ions at an energy between about 3 to 10 KeV, at a dose between about 1E14 to 1E16 atoms/$cm^2$.

13. The method of claim 1, wherein said composite insulator spacers, located on the sides of said buried stack capacitor structure is comprised of an underlying silicon nitride component, at a thickness between about 150 to 250 Angstroms, and of an overlying silicon oxide component at a thickness between about 900 to 1100 Angstroms.

14. A method of fabricating a buried stack capacitor structure on a semiconductor substrate, featuring a storage node structure formed in a ring shaped storage node opening, overlying and contacting a heavily doped region located at the junction created by said ring shaped storage node opening and by said semiconductor substrate, comprising the steps of:

growing a first silicon oxide on said semiconductor substrate;

depositing a silicon nitride layer;

performing a first dry etch procedure to form a shallow trench shape in said silicon nitride layer, in said first silicon oxide layer, and in a top portion of said semiconductor substrate;

depositing a second silicon oxide layer completely filling said shallow trench shape;

removing portions of said second silicon oxide layer from top surface of said silicon nitride layer resulting in an insulator filled, shallow trench isolation (STI) region;

depositing a third silicon oxide layer;

forming a photoresist shape on said third silicon oxide layer with said photoresist shape comprised with an opening which exposes a ring shaped, peripheral region inside said STI region, and which exposes a region outside of, but adjacent to said STI region, while a portion of said photoresist shape, located in center of said STI region, remains overlying a portion of said third silicon oxide layer;

performing a second dry etch patterning procedure to remove material exposed in said opening in said photoresist shape, resulting in a self-aligned, ring shaped storage node opening comprised of thinned, said second silicon oxide layer located only in said peripheral region in said STI region, surrounded by an unetched portion of said second silicon oxide layer located m center of STI region, and with said second dry etch procedure terminating at a top surface of said silicon nitride layer in an area in which said silicon nitride layer overlays a portion of said semiconductor substrate located adjacent to said ring-shaped storage node opening;

performing wet etch procedures to laterally pull back portions of said silicon nitride layer, and portions of said first silicon oxide layer, resulting in a bare top surface portion of said semiconductor substrate, and in combination with bare silicon sides located in partially etched STI region, create a bare silicon region;

removing said photoresist shape;

performing a first ion implantation procedure to form said heavily doped region in said bare silicon region;

depositing a first polysilicon layer;

performing a second ion implantation procedure to form a first doped polysilicon layer;

depositing a composite insulator layer;

performing a chemical mechanical polishing procedure to define a polysilicon storage node structure, overlaid with said composite insulator layer, in said ring shaped storage node opening, with a portion of said polysilicon storage node structure located overlying said heavily doped region;

removing said silicon nitride layer and said first silicon oxide layer;

growing a fourth silicon oxide layer on exposed regions of said semiconductor substrate;

removing said composite insulator layer from top surface of said polysilicon storage node structure;

forming a capacitor dielectric layer on said polysilicon storage node structure;

depositing a second polysilicon layer;

performing a third ion implantation procedure to form a second doped polysilicon layer;

performing a third dry etch procedure to form a polysilicon upper plate structure, resulting in said buried stacked capacitor structure comprised of said polysilicon upper plate structure, said capacitor dielectric layer, and said polysilicon storage node structure; and forming composite insulator spacers on the sides of said buried stack capacitor structure.

15. The method of claim 14, wherein said first silicon oxide layer is obtained via thermal oxidation procedures at a thickness between about 50 to 300 Angstroms.

16. The method of claim 14, wherein said silicon nitride layer is obtained via LPCVD or PECVD procedures at a thickness between about 1000 to 2000 Angstroms.

17. The method of claim 14, wherein said shallow trench shape is formed in said silicon nitride layer, in said first silicon oxide layer, and to a depth in said semiconductor substrate between about 2000 to 5000 Angstroms, via said first dry etching procedure using $CF_4$ as an etchant for silicon nitride and silicon oxide, and using $Cl_2$ or $SF_6$ as an etchant for silicon.

18. The method of claim 14, wherein said second silicon oxide layer, used to fill said shallow trench shape, is obtained via LPCVD or PECVD procedures at a thickness between about 4000 to 9000 Angstroms, using tetraethylorthosilicate (TEOS) as a source.

19. The method of claim 14, wherein said ring shaped storage node opening is formed in said STI region via said second dry etch procedure, which is a selective RIE procedure using $CHF_3$ as an etchant for silicon oxide, with an etch rate ratio of silicon oxide to silicon nitride between about 3 to 10, to 1.

20. The method of claim 14, wherein the depth o, or the thickness of second silicon oxide removed during formation of, said ring shaped storage node opening, is between about 1000 to 3000 Angstroms.

21. The method of claim 14, wherein said wet etch procedures used to laterally remove portions of said silicon nitride layer are accomplished using a hot phosphoric acid, while a BHF or DHF solution is used to laterally remove portions of said first silicon oxide layer.

22. The method of claim 14, wherein said first ion implantation procedure, used to create said heavily doped region, is performed via implantation of boron or $BF_2$ ions at a energy between about 3 to 10 KeV, and at a dose between about 1E14 to 1E16 atoms/$cm^2$.

23. The method of claim 14, wherein said first polysilicon layer, used for said polysilicon storage node structure, is an intrinsic polysilicon layer, obtained via LPCVD procedures to a thickness between about 100 to 500 Angstroms.

24. The method of claim 14, wherein said composite insulator layer is comprised of an underlying silicon nitride layer, obtained via LPCVD or PECVD procedures at a thickness between about 40 to 60 Angstroms, and comprised of an overlying silicon oxide layer obtained via LPCVD or PECVD procedures at a thickness between about 250 to 350 Angstroms.

25. The method of claim 14, wherein said capacitor dielectric layer is an oxidized silicon nitride (NO) layer, obtained at a thickness between about 40 to 60 Angstroms, via oxidation of a silicon nitride layer which in turn is obtained via LPCVD or PECVD procedures to a thickness between about 40 to 60 Angstroms.

26. The method of claim 14, wherein said second polysilicon layer, used for said polysilicon upper plate structure, is an intrinsic polysilicon layer obtained via LPCVD procedures at a thickness between about 200 to 800 Angstroms.

27. The method of claim 14, wherein said composite insulator spacers, located on the sides of said buried stack capacitor structure, are comprised of an underlying silicon nitride component, at a thickness between about 150 to 250 Angstroms, and of an overlying silicon oxide component at a thickness between about 900 to 1100 Angstroms.

* * * * *